United States Patent
Motwani (10) Patent No.: US 8,667,360 B2
(45) Date of Patent: Mar. 4, 2014

(54) APPARATUS, SYSTEM, AND METHOD FOR GENERATING AND DECODING A LONGER LINEAR BLOCK CODEWORD USING A SHORTER BLOCK LENGTH

(75) Inventor: Ravi H. Motwani, Santa Clara, CA (US)

(73) Assignee: Intel Corporation, Santa Clara, CA (US)

(*) Notice: Subject to any disclaimer, the term of this patent is extended or adjusted under 35 U.S.C. 154(b) by 284 days.

(21) Appl. No.: 13/175,602

(22) Filed: Jul. 1, 2011

(65) Prior Publication Data

US 2013/0007561 A1 Jan. 3, 2013

(51) Int. Cl.
*H03M 13/00* (2006.01)

(52) U.S. Cl.
USPC .......................... 714/752; 714/755; 714/758

(58) Field of Classification Search
USPC .......................... 714/752, 755, 758
See application file for complete search history.

(56) References Cited

U.S. PATENT DOCUMENTS

| 7,516,391 B2 | 4/2009 | Kyung et al. |
| 7,661,037 B2 | 2/2010 | Niu et al. |
| 2005/0091570 A1 | 4/2005 | Eroz et al. |
| 2005/0154958 A1 | 7/2005 | Xia et al. |
| 2007/0266300 A1* | 11/2007 | Ito et al. ............... 714/770 |
| 2009/0199073 A1* | 8/2009 | Kanaoka et al. ........ 714/758 |
| 2012/0089884 A1* | 4/2012 | Kamiya ................. 714/752 |

OTHER PUBLICATIONS

International Search Report and Written Opinion issued for International Patent Application No. PCT/US2012/045284, mailed Jan. 24, 2013, 12 pages.

* cited by examiner

*Primary Examiner* — Sam Rizk
(74) *Attorney, Agent, or Firm* — Blakely, Sokoloff, Taylor & Zafman LLP (57) ABSTRACT

An apparatus, system, and method for generating and decoding a longer linear block codeword using a shorter block length. The method comprises receiving data from a storage area and generating a codeword from the received data with an encoder, the codeword having a data portion and a parity portion, wherein the codeword has a first block length, and wherein the encoder applies a linear block code, the linear block code having a second block length that is shorter than the first block length.

28 Claims, 11 Drawing Sheets

APPARATUS, SYSTEM, AND METHOD FOR GENERATING AND DECODING A LONGER LINEAR BLOCK CODEWORD USING A SHORTER BLOCK LENGTH

FIELD OF THE INVENTION

Embodiments of the invention relate generally to the field of error detection and correction. More particularly, embodiments relate to an apparatus, system, and method for generating and decoding a longer linear block codeword using a shorter block length.

BACKGROUND

Error control codes may be used in many applications, such as in error detection or correction for communication or data storage systems. For example, error control codes may be used to correct errors occurring in storage devices, such as in hard drives or NAND memories. Error control codes could also be used to detect or correct errors in data received across a noisy channel.

Attributes of error control codes, such as the type of error control code and an error control code's block length, can impact the coding gain and the complexity of the encoding and decoding implementation. One type of error control code is a Bose-Chaudhuri-Hocquenghem (BCH) code. Another type of error code is a low-density parity-check (LDPC) code. The block length also impacts implementation complexity. For example, in an LDPC code, a larger block length results in increased encoding and decoding complexity.

BRIEF DESCRIPTION OF THE DRAWINGS

Embodiments will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments relate to an apparatus, system, and method for generating and decoding a longer linear block codeword using a shorter block length.

The term "codeword" refers to encoded data comprising a data portion and a portion of information used for error detection or correction. In one embodiment, the portion of information used for error detection or correction is a parity portion. According to one embodiment, an encoder generates codewords. According to another embodiment, the encoder generates the information used for error detection or correction, and another logic unit generates the codewords by combining the data portion with the generated information.

The term "linear block codeword" means a codeword in a linear block code. The term "code" means a set of valid codewords. A linear block code is a subspace of a Galois field. The term "block length" refers to the length of a codeword. A code, being a set of codewords, also has a block length.

In one embodiment, a codeword is decoded to recover encoded data. In one such embodiment, recovering the encoded data by decoding of the codeword comprises correcting errors in the codeword. In one embodiment, correcting errors in the codeword comprises correcting errors in both the data portion and the parity portion of the codeword.

According to one embodiment, a longer linear block codeword is decoded by independently decoding shorter codewords, wherein the shorter codewords have a block length that is shorter than that of the longer linear block codeword. For example, in one embodiment, the longer linear block codeword comprises a data portion having a length of 4 Kbytes and a parity portion having a length of 500 bytes, and the shorter codewords each have a data portion having a length of 1 Kbyte and a parity portion of 100 bytes. In one such embodiment, the block lengths of the longer linear block codeword and each of the shorter codewords are 4.5 Kbytes and 1.1 Kbytes, respectively.

In one embodiment, partial decoding of the longer linear block codeword may be sufficient to recover encoded data. In one embodiment, if partial decoding is unsuccessful, then full decoding may be resorted to. According to one embodiment, higher coding gain may be achieved with less decoding complexity. The term "coding gain" means the difference in the input bit error rate required to achieve the same output bit error rate without an error control code as with an error control code. According to one embodiment, a coding gain that is comparable to the coding gain achieved with a longer linear block length may be achieved with decoding complexity that is similar in complexity to that for a shorter block length LDPC decoder.

Embodiments may be implemented for any number of error detection or correction applications, such as for non-volatile memories or for the transmission of data over a communication channel. In one such embodiment, the non-volatile memories may be NAND memories. Embodiments may also be implemented for dynamic static random access memory (DRAM), or for other types of storage devices.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In the following description and claims, the term "coupled" and its derivatives may be used. The term "coupled" herein may refer to two or more elements which are in direct contact (physically, electrically, magnetically, optically, etc.). The term "coupled" herein may also refer to two or more elements that are not in direct contact with each other, but still cooperate or interact with each other.

Figure 1:
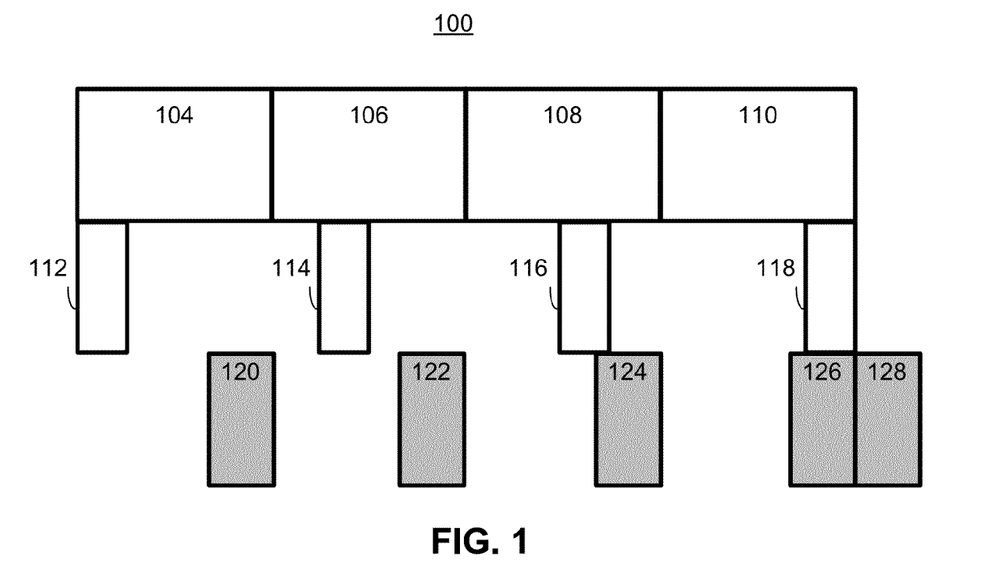
FIG. 1 is a block diagram illustrating data and parity portions for generating a longer linear block codeword using a shorter block length according to one embodiment.

FIG. 1 is a block diagram 100 illustrating data and parity portions for generating a longer linear block codeword using a shorter block length according to one embodiment. In one embodiment, data is received and divided into four data blocks 104, 106, 108, and 110. Although this illustration shows the data being divided into four blocks, the data could be divided into any number of blocks.

In one embodiment, one fourth of each of the data blocks 104, 106, 108, and 110 is selected as portions 112, 114, 116, and 118. In one embodiment an equal portion of each of the data blocks 104, 106, 108, and 110 is selected. In one embodiment, the portions 112, 114, 116, and 118 may be selected from any portion of the data blocks 104, 106, 108, and 110. For example, in one embodiment, the portions 112, 114, 116, and 118 are selected from the upper most bits of the data blocks 104, 106, 108, and 110. In another embodiment, the portions 112, 114, 116, and 118 may be selected from different bit ranges of the data blocks 104, 106, 108, and 110. In another embodiment, the selected data could be selected from any number of the data blocks. For example, in one embodiment the selected portions 112, 114, 116, and 118 could be selected entirely from data block 104.

In one embodiment, each of the data blocks 104, 106, 108, and 110 is encoded with an encoder to generate corresponding parity portions 120, 122, 124, and 126. According to one embodiment, corresponding codewords comprise a data portion, which is the data from a data block 104, 106, 108, and 110, and a corresponding parity portion, represented by blocks 120, 122, 124, and 126. For example, according to one embodiment, one of the corresponding codewords comprises data block 104 and the parity portion 120.

In one embodiment, the selected portions 112, 114, 116, and 118 have a combined length equal to each of the data blocks 104, 106, 108, and 110. In one embodiment, the selected portions 112, 114, 116, and 118 are encoded to generate another parity portion 128. In one embodiment, another codeword is generated comprising the selected portions 112, 114, 116, and 118 and the other parity portion 128.

According to one embodiment, the longer linear block codeword comprises data portions 104, 106, 108, and 110, the corresponding parity portions 120, 122, 124, and 126, and the other parity portion 128. In another embodiment, the codeword further comprises the selected portions 112, 114, 116, and 118.

The ratio of data portions 104, 106, 108, and 110 to parity portions 120, 122, 124, 126, and 128 in the codeword could be any number. Higher ratios may result in less overhead and increased performance. For example, in one embodiment, the ratio may be between 89 and 91 percent. Lower ratios may result in a more robust error correction scheme with higher coding gain. For example, in one embodiment the ratio may be 50 percent. In another embodiment, the ratio may be lower than 50 percent.

In one embodiment, the data portions 104, 106, 108, and 110 and the parity portions 120, 122, 124, 126, and 128 may be distributed in any order in the codeword. For example, in one embodiment, the first portion of the codeword may comprise the data portions 104, 106, 108, and 110 and the last portion of the codeword may comprise the parity portions 120, 122, 124, 126, and 128. In another embodiment, the data portions 104, 106, 108, and 110 may be in the last portion of the codeword. In yet another embodiment, the data portions 104, 106, 108, and 110 and the parity portions 120, 122, 124, 126, and 128 may be distributed according to an algorithm.

Figure 2:
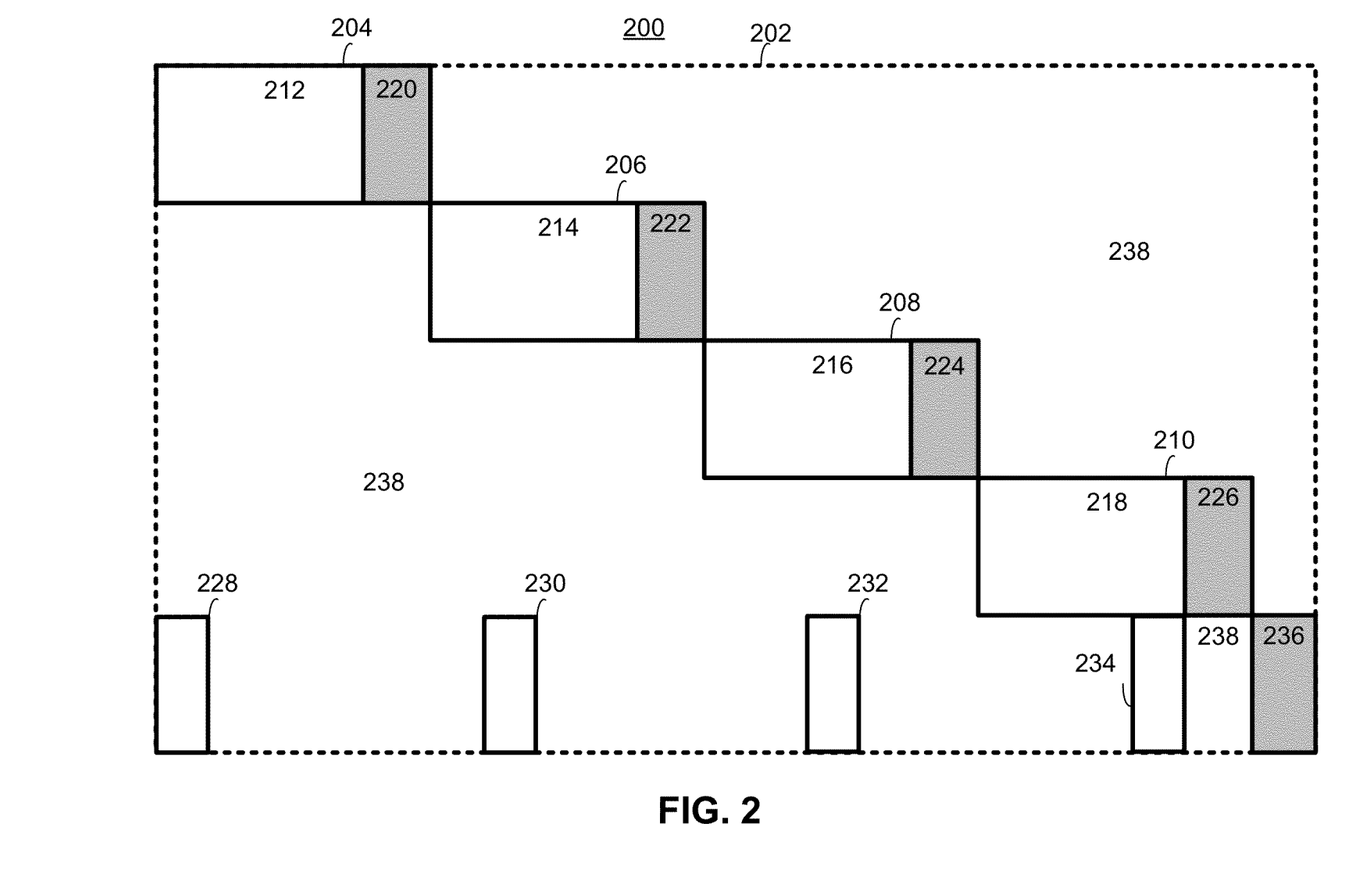
FIG. 2 is a block diagram illustrating a parity-check matrix for a longer linear block codeword using a shorter block length according to one embodiment.

FIG. 2 is a block diagram 200 illustrating a parity-check matrix 202 (also known as an "H matrix") for a longer linear block codeword using a shorter block length according to one embodiment. FIG. 2 illustrates how a codeword with a longer block length can be generated using a shorter block length according to one embodiment. In one embodiment, the parity-check matrix 202 represents a set of parity-check equations for an LDPC code. A "parity-check equation" is an equation for computing the parity of a data portion of a codeword. For example, in one embodiment, a parity-check equation involves summing, modulo 2, some combination of bits in a data portion of a codeword to obtain a parity bit. In one embodiment, the parity-check matrix 202 comprises parity-check matrices with shorter block lengths 204, 206, 208, and 210. In one embodiment, the parity-check matrices with shorter block lengths 204, 206, 208, and 210 comprise data portions 212, 214, 216, and 218 and parity portions 220, 222, 224, and 226. In one embodiment, the parity-check matrix 202 further comprises a parity-check matrix comprising 228, 230, 232, 234, and 236, which correspond to the selected portions 112, 114, 116, and 118 and the other parity portion 128 of FIG. 1. According to one embodiment, the parity portions 220, 222, 224, 226, and 236 are located in the last portion of the rows of the parity-check matrix 202. In one embodiment, the remaining portions 238 of the parity-check matrix 202 are zeros.

Although FIG. 2 illustrates parity-check equations with a matrix 202, in one embodiment, parity-check equations may be represented with other graphical representations. For example, in one embodiment, parity-check equations may be represented by a bipartite graph such as a Tanner graph.

Some embodiments may be described as a process which is usually depicted as a flowchart, a flow diagram, a structure diagram, or a block diagram. Although a flowchart may describe the operations as a sequential process, many of the operations can be performed concurrently (i.e., in parallel). Likewise, operations in a flowchart illustrated as concurrent processes may be performed sequentially in some embodiments. In addition, the order of the operations may be rearranged. A process is terminated when its operations are completed. A process may correspond to a method, a program, a procedure, a method of manufacturing or fabrication, etc.

Figure 3:
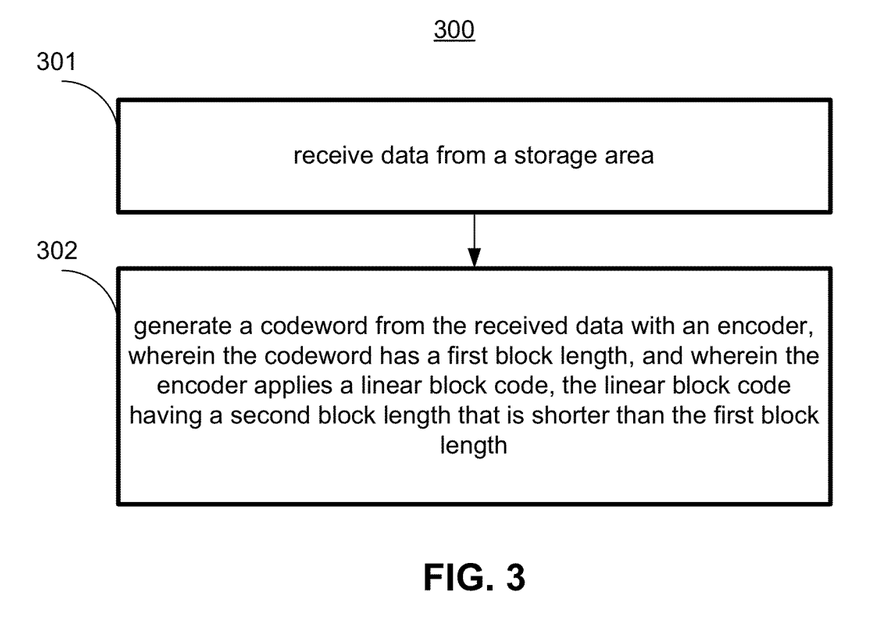
FIG. 3 is a flowchart illustrating the generation of a longer linear block codeword using a shorter block length according to one embodiment.

FIG. 3 is a flowchart 300 illustrating the generation of a longer linear block codeword using a shorter block length according to one embodiment.

According to one embodiment, at block 301, data is received from a storage area. In one embodiment, the storage area may be local. For example, in one such embodiment, the storage area may be located in a system which is generating the codeword. In one such embodiment, the storage area may be included in a solid-state drive (SSD). In another embodiment, the storage area may be remote. For example, in one such embodiment, the storage area may be located on a system which is separate from the system generating the codeword. In one such embodiment, the data may be received over a communication channel such as a telecommunications network, for example, the internet or a computer network.

Next, at block 302, a codeword having a first length is generated with an encoder that applies a linear block code, wherein the linear block code has a second block length that is shorter than the first block length.

In one embodiment, the applied linear block code is an LDPC code. In another embodiment, the applied linear block code is a BCH code. In yet another embodiment, the applied linear block code could be another linear block code.

Figure 4:
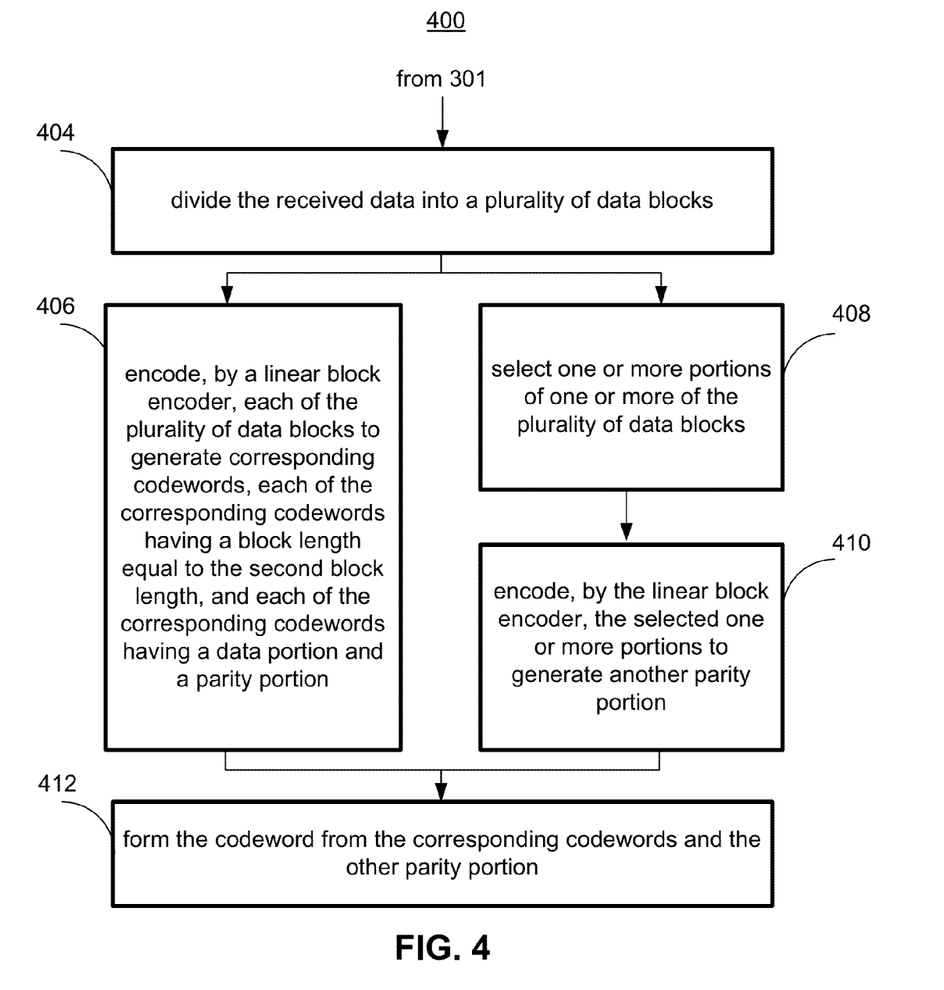
FIG. 4 is a flowchart illustrating the generation of a longer linear block codeword using a shorter block length according to another embodiment.

FIG. 4 is a flowchart 400 illustrating the generation of a longer linear block codeword using a shorter block length according to another embodiment. The flow chart 400 of FIG. 4 is illustrated with reference to the embodiments of FIG. 1. The flowchart 400 of FIG. 4 continues from block 301 of FIG. 3.

In one embodiment, at block 404, after receiving data from the storage area, the received data is divided into a plurality of data blocks 104, 106, 108, and 110. In one embodiment, each of the plurality of data blocks 104, 106, 108, and 110 has the same length. In another embodiment, the plurality of data blocks 104, 106, 108, and 110 may be of different lengths. In one such embodiment, some of the plurality of data blocks 104, 106, 108, and 110 may be zero-padded to enable the use of the same encoding and decoding hardware for each of the plurality of data blocks 104, 106, 108, and 110, despite having different lengths. In one embodiment, the number of data blocks 104, 106, 108, and 110 that the received data is divided into is an even number. In another embodiment, the number of data blocks 104, 106, 108, and 110 is four. In yet another embodiment, the number of data blocks 104, 106, 108, and 110 is an odd number.

The paths beginning at blocks 406 and 408 may be in parallel (as illustrated in flowchart 400) or sequential. For example, in one embodiment, the operations of blocks 406 and 408 may be performed concurrently. In another embodiment, the operations in block 408 may occur before or after the operations in block 406.

At block 406, each of the plurality of data blocks 104, 106, 108, and 110 is encoded with an encoder to generate a plurality of corresponding codewords. In one embodiment, each of the plurality of corresponding codewords, as well as the code applied by the encoder, has a block length that is equal to the second block length. According to one embodiment, each of the corresponding codewords comprises a data portion 104, 106, 108, and 110 and a parity portion 120, 122, 124, and 126.

At block 408, one or more portions 112, 114, 116, and 118 of one or more of the plurality of data blocks 104, 106, 108, and 110 are selected. In embodiments, this selection could occur at any time after receiving the data. For example, in one embodiment, the selection of one or more portions 112, 114, 116, and 118 could occur prior to dividing the received data. In one embodiment, the selection of one or more portions 112, 114, 116, and 118 could occur after dividing the received data into a plurality of data blocks 104, 106, 108, and 110 and concurrently with the encoding of the plurality of data blocks 104, 106, 108, and 110. In one embodiment, the selected portions 112, 114, 116, and 118 may comprise an equal portion from each of the plurality of data blocks 104, 106, 108, and 110.

At block 410, after selecting the one or more portions 112, 114, 116, and 118, the one or more portions 112, 114, 116, and 118 are encoded with the encoder to generate another parity portion 128. In one embodiment, prior to encoding the selected portions 112, 114, 116, and 118, at least one of the selected portions 112, 114, 116, and 118 is queued in a buffer.

At block 412, the codeword is formed from the plurality of corresponding codewords and the other parity portion 128, according to one embodiment. In one such embodiment, the length of the data portion of the codeword is an integer multiple of the length of the data portion of each of the corresponding codewords. For example, in one such embodiment, the length of the data portion of the codeword is 4 Kbytes and the length of the data portion of each of the corresponding codewords is 1 Kbyte. In another embodiment, the lengths of the data portions of the codeword and of each of the corresponding codewords may be 8 Kbytes and 1 Kbyte, or 8 Kbytes and 2 Kbytes, respectively. In another embodiment, the codeword further comprises another codeword, the other codeword comprising the other parity portion 128 and the selected one or more portions 112, 114, 116, and 118.

Figure 5:
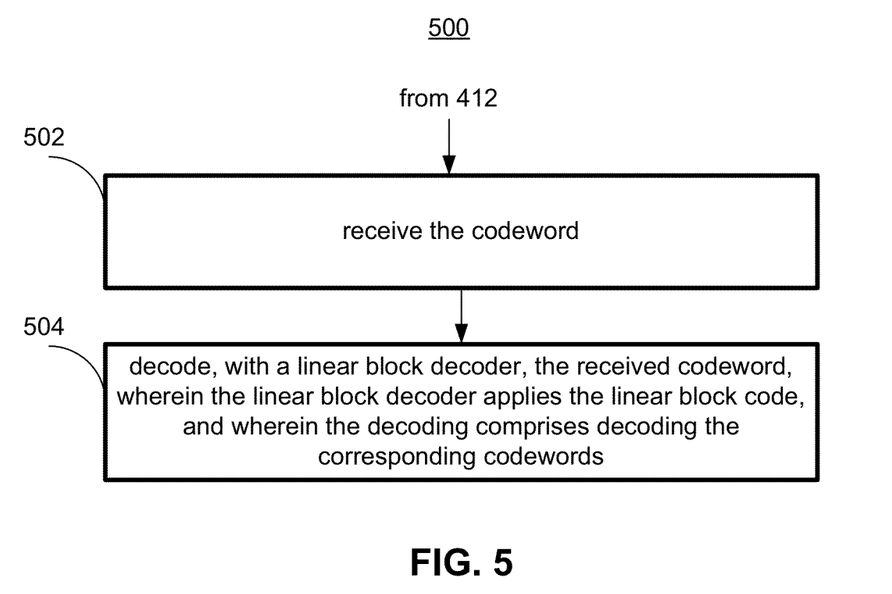
FIG. 5 is a flowchart illustrating decoding a longer linear block codeword using a shorter block length according to one embodiment.

FIG. 5 is a flowchart 500 illustrating decoding a longer linear block codeword using a shorter block length according to one embodiment. The flowchart 500 of FIG. 5 continues from block 412 of FIG. 4.

At block 502, the codeword is received. At block 504, the received codeword is decoded with a decoder, wherein the decoder applies the linear block code, and wherein the decoding comprises decoding the corresponding codewords. In one embodiment, the decoding of the corresponding codewords is done with parity-check matrices having shorter block lengths 204, 206, 208, and 210. In one embodiment, the decoder applies hard input decoding. In another embodiment, the decoder applies soft input decoding. For example, in one embodiment the decoder may perform just one read to generate hard information. In another embodiment, multiple reads corresponding to different reference voltages are performed to generate soft information.

The codeword could be received from any number of locations. For example, in one embodiment, the codeword is received from a non-volatile memory located on the system decoding the codeword. In another embodiment, the codeword is received from a remote location. For example, the codeword may be received over the internet from a system that is separate from the system decoding the codeword.

Figure 6:
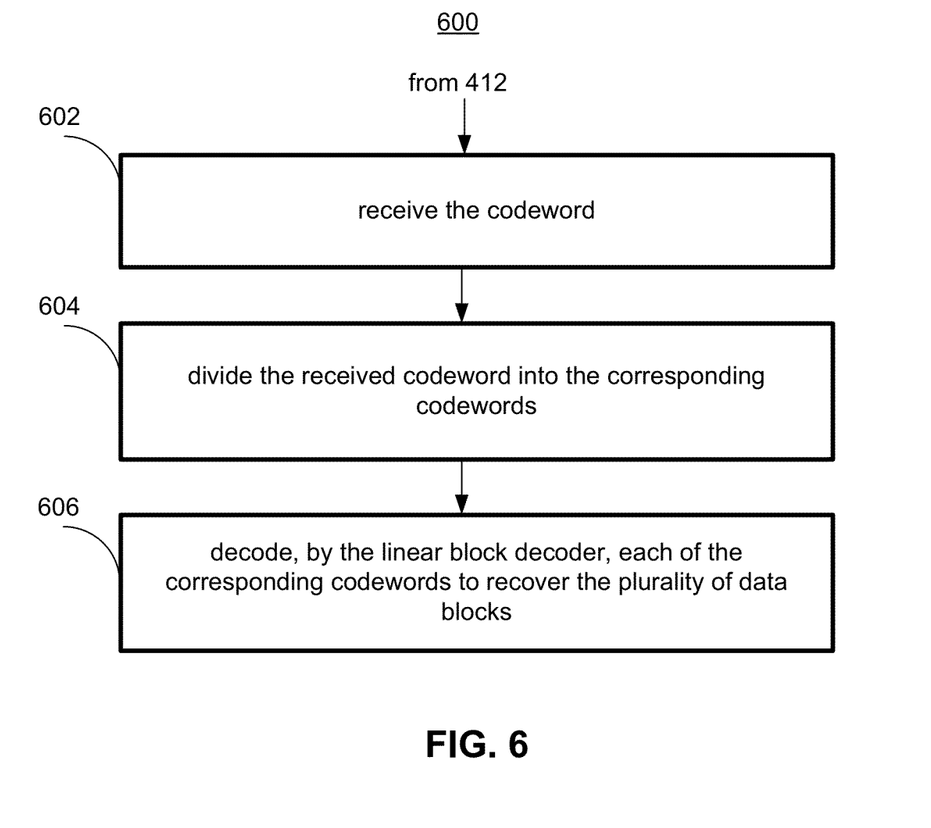
FIG. 6 is a flowchart illustrating decoding a longer linear block codeword using a shorter block length according to another embodiment.

FIG. 6 is a flowchart 600 illustrating another embodiment in which a longer linear block codeword is decoded using a shorter block length. The flowchart 600 of FIG. 6 continues from block 412 of FIG. 4.

At block 602, the codeword is received. At block 604, the received codeword is divided into the corresponding codewords. In one embodiment, each of the corresponding codewords comprises a data portion 104, 106, 108, and 110 and a corresponding parity portion 120, 122, 124, and 126. At block 606, each of the corresponding codewords is decoded. In one embodiment, the decoding of the corresponding codewords occurs sequentially. In one such embodiment, the hardware implementation for decoding the codeword may comprise a single decoder to apply the linear block code. In another embodiment, the decoding of the corresponding codewords occurs concurrently. In one such embodiment, performance (e.g., the speed of decoding due to parallel processing) increases may be achieved at the cost of more hardware. For example, one such hardware implementation would comprise more than one decoder to apply the linear block code.

Figure 7:
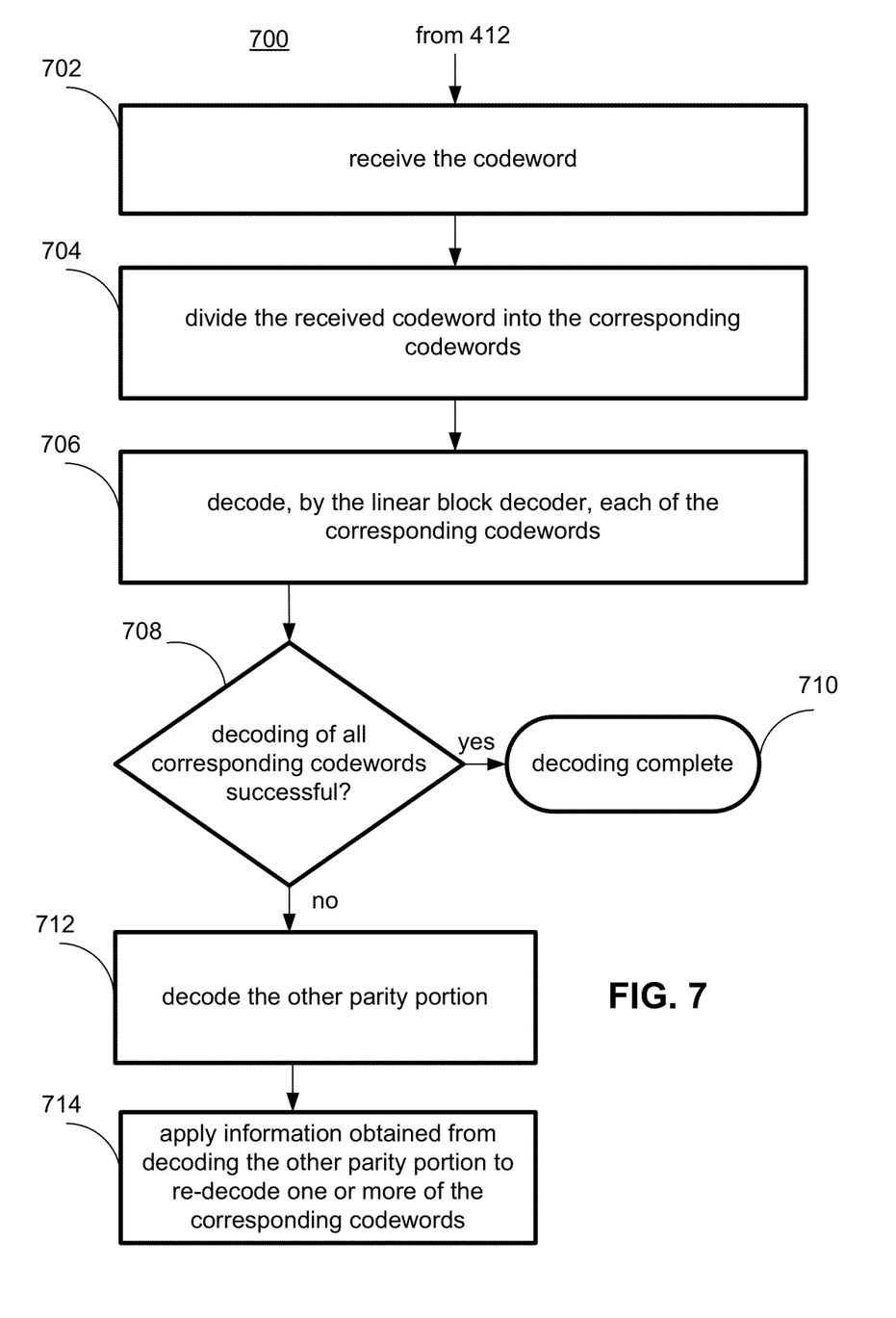
FIG. 7 is a flowchart illustrating decoding a longer linear block codeword using a shorter block length according to another embodiment.

FIG. 7 is a flowchart 700 illustrating another embodiment in which a longer linear block codeword is decoded using a shorter block length. The flowchart 700 of FIG. 7 continues from block 412 of FIG. 4.

At block 702, the codeword is received. At block 704, the received codeword is divided into the corresponding codewords. At block 706, each of the corresponding codewords is decoded. At block 708, if a determination is made that the decoding of all of the corresponding codewords was successful, then the process of decoding is complete as indicated by block 710. In one embodiment, a codeword is successfully decoded if the syndrome is equal to 0, wherein the syndrome is $cH^T$, c being the codeword and H being a parity-check matrix.

At block 708, if a determination is made that the decoding of one or more of the corresponding codewords was unsuccessful, at block 712, the other parity portion is decoded. According to one embodiment, the decoding of the other parity portion may comprise receiving the codeword again and extracting the selected portions from the data portion of the received codeword. In another embodiment, the selected portions are buffered, and therefore decoding the other parity portion does not comprise receiving the codeword again.

At block 714, information obtained from decoding the other parity portion is applied to re-decode one or more of the corresponding codewords. In one embodiment, recovering one or more unsuccessfully decoded corresponding codewords may be done in a variety of ways. In one embodiment, the corresponding codewords are decoded via hard decision decoding. In another embodiment, soft information combination is applied. In one such embodiment, the soft information combining is done in a similar way as the soft information is updated at the bit node of a min-sum LDPC decoder. For example, in one embodiment, extrinsic information from another codeword (comprising the other parity portion) is treated as independent information and added to a channel Log Likelihood Ratio (LLR) of failed portions of one or more of the unsuccessfully decoded corresponding codewords.

In one embodiment, the information obtained from decoding the other parity portion is applied only to unsuccessfully decoded codewords. In one embodiment, only the unsuccessfully decoded corresponding codewords are re-decoded. In another embodiment, all of the corresponding codewords are re-decoded.

Figure 8:
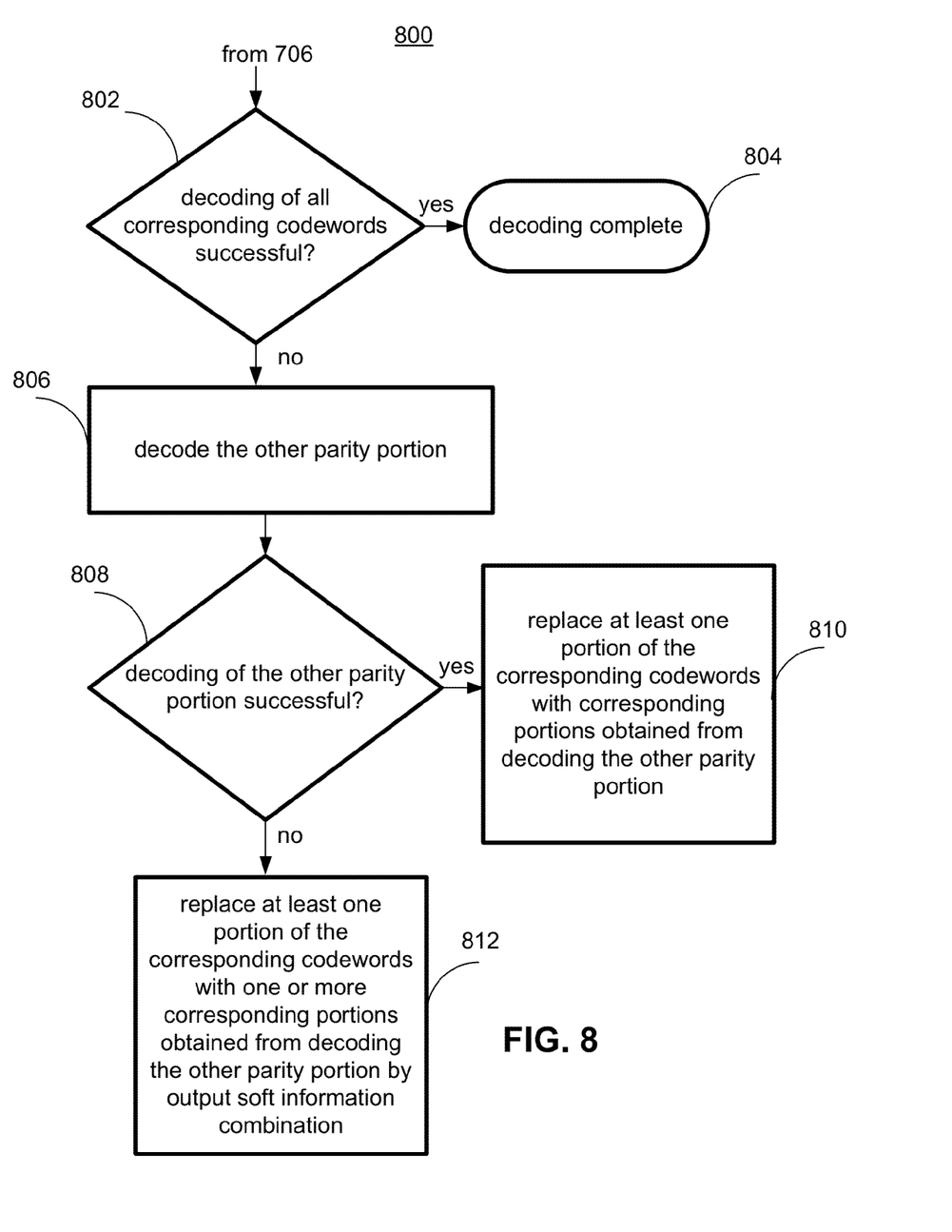
FIG. 8 is a flowchart illustrating decoding a longer linear block codeword using a shorter block length according to another embodiment.

FIG. 8 is a flowchart 800 illustrating another embodiment in which a longer linear block codeword is decoded using a shorter block length. The flowchart 800 of FIG. 8 continues from block 706 of FIG. 7.

At block 802, if a determination is made that the decoding of all of the corresponding codewords was successful, then the process of decoding is complete as indicated by block 804. At block 802, if a determination is made that the decoding of one or more of the corresponding codewords was unsuccessful, at block 806, the other parity portion is decoded. At block 808, if a determination is made that the decoding of the other parity portion is successful, at block 810, at least one portion of the corresponding codewords is replaced with one or more corresponding portions obtained from decoding the other parity portion. In one embodiment, only the unsuccessfully decoded corresponding codewords have their portions replaced.

At block 808, if a determination is made that the decoding of the other parity portion is unsuccessful, at block 812, at least one portion of the corresponding codewords is replaced with the one or more corresponding portions obtained from decoding the other parity portion by output soft information combination, according to one embodiment. In another embodiment, unsuccessful decoding of the other parity portion may result in no portions the corresponding codewords being replaced.

Figure 9:
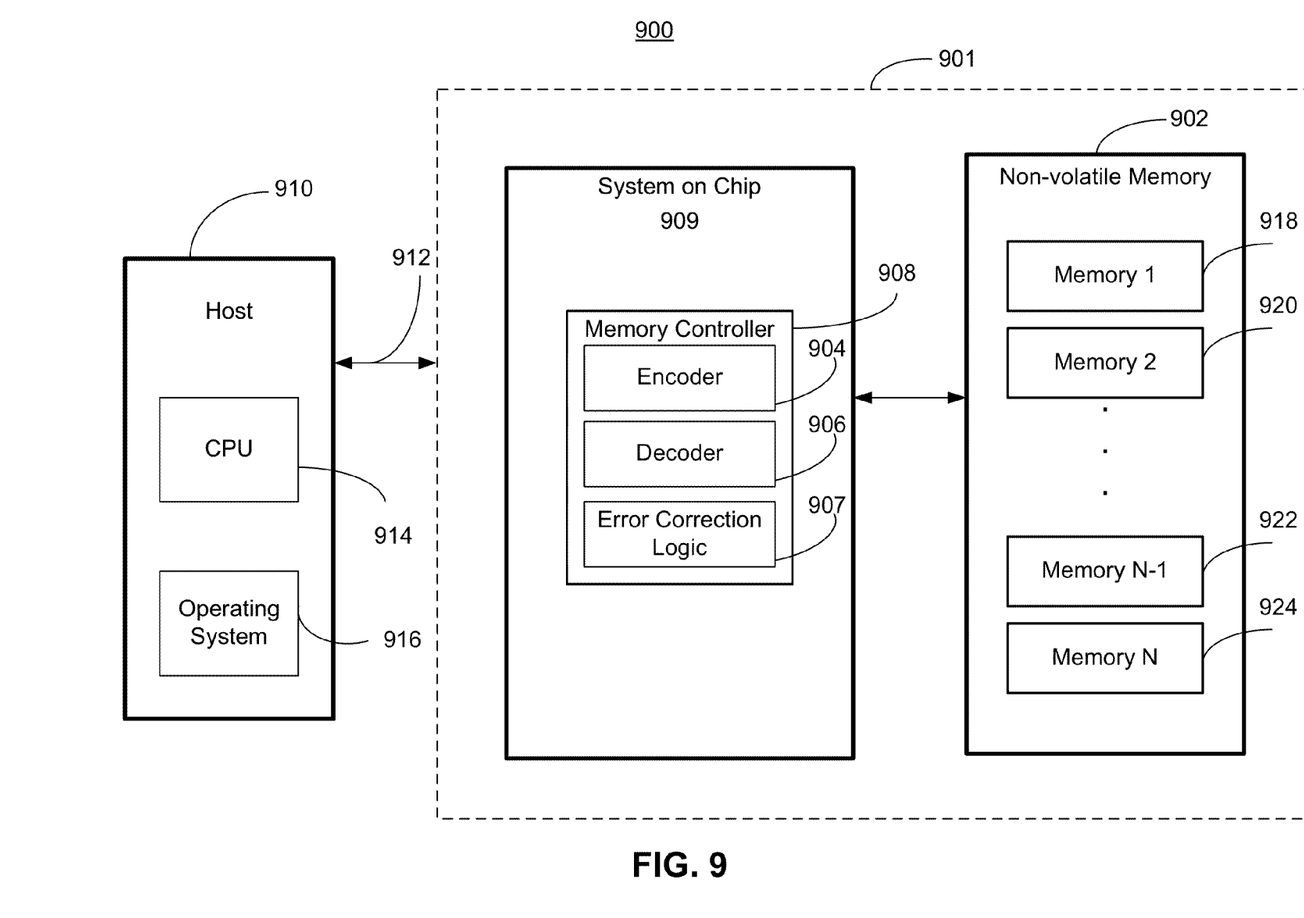
FIG. 9 is a system diagram comprising a solid-state drive, the solid-state drive comprising logic to generate and decode a longer linear block codeword using a shorter block length according to one embodiment.

FIG. 9 is a system 900 according to one embodiment with a non-volatile memory 902 and logic operable to generate a codeword having a block length equal to the first block length using the second block length (wherein the first and second block lengths are the same as those referred to in block 302 of FIG. 3). In one embodiment, the logic operable to generate the codeword having a block length equal to the first block length comprises an encoder 904, a decoder 906, and error correction logic 907.

In one embodiment, the system 900 comprises a solid-state drive (SSD) 901. In one embodiment, the system 900 comprises a system on chip (SOC) 909 including a memory controller 908, and a processor 914 coupled to the memory controller 908. In one embodiment the memory controller 908 comprises the logic operable to generate the codeword having a block length equal to the first block length using the second block length, including the encoder 904, the decoder 906, and the error correction logic 907. In one embodiment, the SOC 909 includes other components, for example, a wireless antenna, memory, processor, etc.

In one embodiment, the SOC 909 communicates with the host 910 via a Serial Advance Technology Attachment (SATA) input-output (I/O) bus 912. In one embodiment, the SOC 909 communicates with the host 910 via a Serially Attached Small System Computer (SAS) input-output (I/O) bus 912. In other embodiments, other types of buses can be used for 912 without changes the essence of the embodiments, for example, any of a Small Computer Systems Interface (SCSI) input-output (I/O) bus, a Fibre Channel (FC) input-output (I/O) bus, a SCSI over Internet input-output (I/O) bus (iSCSI), or a Universal Serial Bus (USB) input-output (I/O) bus.

In accordance with such embodiments, if the host 910 is to exchange data and/or commands with a memory device in accordance with a SCSI protocol, the SCSI protocol may comply and/or be compatible with the protocol described in American National Standards Institute (ANSI) Small Computer Systems Interface-2 (SCSI-2) ANSI/InterNational Committee for Information Technology Standards (INCITS) 131-1994 Specification.

In one embodiment, the SOC 909 and the non-volatile memory 902 is part of the SSD 901. In one such embodiment, the SOC 909 is an SSD controller. In one embodiment, the SSD 901 is positioned inside a personal computer, a tablet, a smart phone (also referred to as a smart device), etc. In one embodiment, the memory controller 908 and/or the SOC 909 is a standalone integrated circuit coupled to the host 910 and the non-volatile memory 902. In another embodiment, the memory controller 908 and/or the SOC 909 is integrated in the host 910.

In one embodiment, the host 910 comprises a processor 914 and an operating system 916. In one embodiment, the processor 914 in the host 910 is a micro-processor designed and manufactured by INTEL CORP. of Santa Clara, Calif. In another embodiment, other processors made and designed by other vendors may be used for the host 910. In one embodiment, the host 910 is one of a personal computer, server, client, laptop, smart-phone, and/or tablet, etc. Embodiments may have one or multiple non-volatile memories 918, 920, 922, and 924 coupled to the memory controller 908. While some embodiments are described with respect to the memory controller 908 communicating with the host 910 and the non-volatile memory 902, it is understood that embodiments also operate with the SOC 909 communicating with the host 910 and the non-volatile memory 902.

In one embodiment, the non-volatile memory 902 is a random-access non-volatile memory (NVRAM). In one embodiment, the non-volatile memory 902 is part of an SSD. In one embodiment the non-volatile memory 902 is a NAND flash memory. In one embodiment the non-volatile memory 902 is a NOR flash memory. In one embodiment, the non-volatile memory 902 is one of a phase change memory (PCM), stacked PCM (PCMS, also referred to as PCM and switch), read-only memory (ROM), electrically erasable programmable read-only memory (EEPROM), or any other type of non-volatile memory device. In one embodiment, the non-volatile memory 902 is a removable drive, e.g., a Universal Serial Bus (USB) memory stick, flash card, etc.

In one embodiment, the memory controller 908 further comprises logic (also referred to as the first logic unit) to receive data, and logic (also referred to as the second logic unit) to divide the received data into a plurality of data blocks and to send each of the plurality of data blocks to the encoder 904, wherein the encoder applies a linear block code to each of the plurality of data blocks to generate corresponding codewords, the applied linear block code and the corresponding codewords having a block length that is equal to the second block length. In one embodiment, the linear block code is an LDPC code. In one embodiment, the memory controller 908 further comprises logic to select and store one or more portions of the received data and logic (also referred to as a fourth logic unit) to send the one or more portions to the encoder 904 to generate another parity portion. In one embodiment, the logic to select and store the one or more portions comprises a buffer. In one embodiment, the memory controller 908 further comprises logic to generate the codeword having a block length that is equal to the first block length from the corresponding codewords and the other parity portion.

In one embodiment, the memory controller 908 further comprises logic (also referred to as the fifth logic unit) to receive the codeword, and logic (also referred to as the sixth logic unit) to divide the received codeword into the corresponding codewords and to send each of the corresponding codewords to the decoder 906.

In one embodiment, the memory controller 908 further comprises logic (also referred to as the seventh logic unit) to determine whether decoding of the corresponding codewords is successful, and logic (also referred to as the eighth logic unit) to send another codeword to the decoder 906 when the decoding of one or more of the corresponding codewords is unsuccessful, wherein the other codeword comprises the selected portions and the other parity portion. In one embodiment, the memory controller 908 further comprises logic (also referred to as the ninth logic unit) operable to replace one or more portions of the corresponding codewords with corresponding portions of the other codeword and logic (also referred to as the tenth logic unit) to resend one or more of the corresponding codewords to the decoder 906. In one such embodiment, that logic is in the error correction logic 907.

Although logic units are referred to individually (for example, "the first logic unit," "the second logic unit," etc.), the functions performed by the logic units may be combined. For example, in one embodiment, the decoder 906 may comprise the fifth logic unit and the sixth logic unit.

Figure 10:
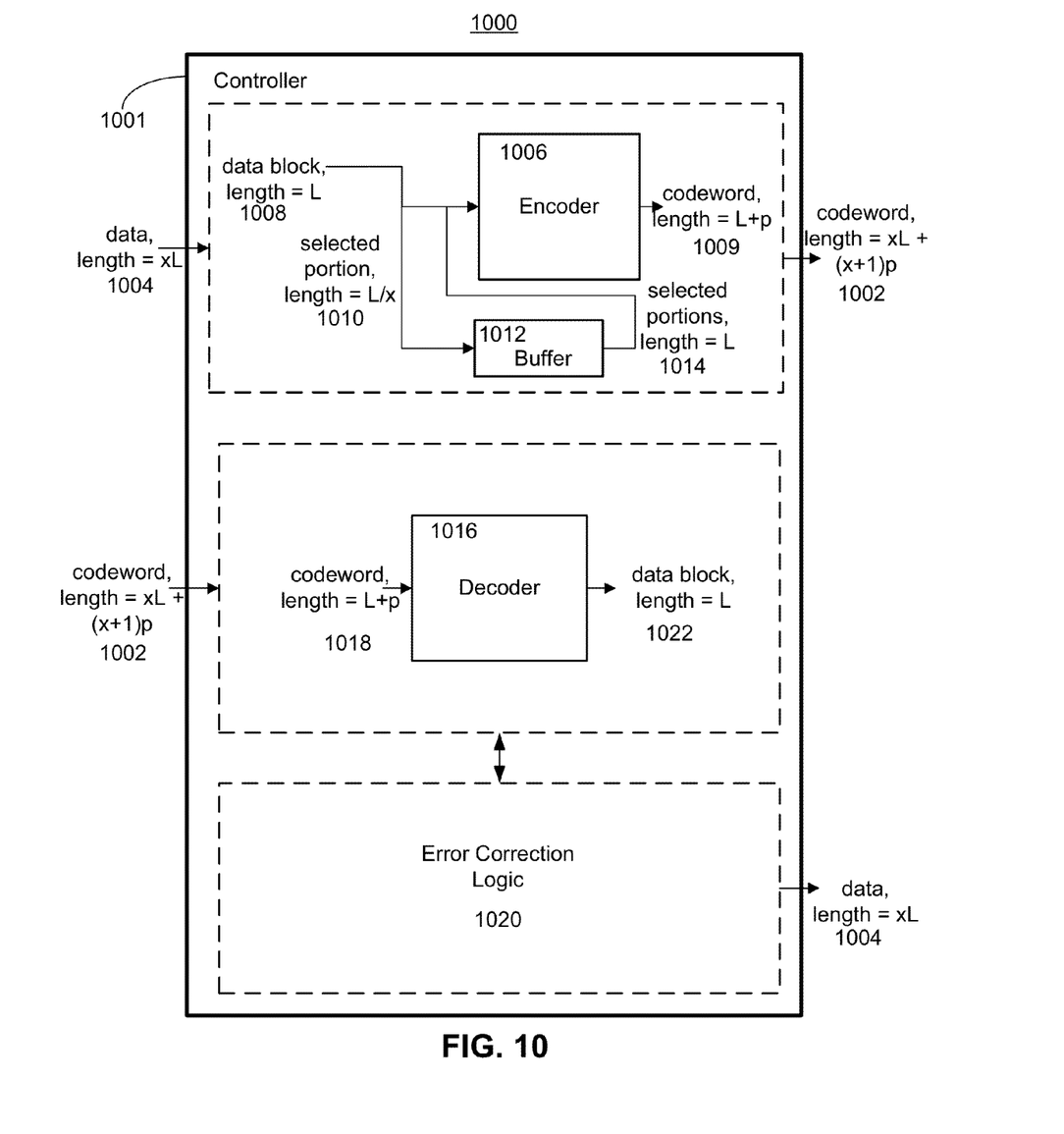
FIG. 10 is a block diagram of a controller comprising logic operable to generate and decode a longer block length codeword using a shorter block length according to one embodiment.

FIG. 10 is a block diagram 1000 of a controller 1001 comprising logic operable to generate and decode a longer block length codeword using a shorter block length according to one embodiment. FIG. 10 is illustrated with reference to the embodiments of FIGS. 3-8. The following description of block diagram 1000 is not intended to limit the embodiments of FIGS. 3-8, but rather to illustrate, according to one embodiment, the relationships amongst the lengths of the data and data blocks, and the block lengths of the codewords.

According to one embodiment, the data 1004 has a length of 'xL', wherein the data 1004 is the same as the received data in block 301 of FIG. 3, and wherein x, a positive integer, is the number of data blocks that the received data is divided into according to block 404 of FIG. 4.

In one embodiment, each of the plurality of data blocks in block 404 of FIG. 4 is sent as a data block 1008 to the encoder 1006, wherein each data block 1008 has a length of 'L'. In one embodiment, the encoder 1006 applies a linear block code having a block length equal to 'L+p', wherein 'p' is the length of a parity portion generated by the encoder 1006. According to one embodiment, the encoder 1006 generates a codeword 1009, wherein the codeword 1009 has a block length equal to 'L+p'. In one embodiment, each of the corresponding codewords in block 406 of FIG. 4, is generated by the encoder 1006 as the codeword 1009.

In one embodiment, at least one of the selected one or more portions in block 408 of FIG. 4 is a selected portion 1010 stored in a buffer 1012. In one embodiment, the buffer 1012 comprises a scan chain. According to one embodiment, the selected portion 1010 is an equal portion of each of the plurality of data blocks referenced in block 406 of FIG. 4. In another embodiment, the length of the selected portion 1010 is 'L/x'. In one embodiment, the buffer 1012 can store 'L(x−1)/x' data. For example, in one embodiment, where the data 1004 is of length 4 Kbytes (i.e., xL=4 Kbytes) and is divided into 4 data blocks (i.e., x=4), the buffer stores 0.75 KBytes of data (i.e., three selected portions, each having a length of 0.25 KBytes). In one such embodiment, once the fourth selected portion is sent to the buffer 1012, a data block of length 1 KByte (i.e., L=1 KByte), referred to as selected portions 1014, is sent to the encoder 1006 to generate another parity portion, wherein the other parity portion is described in block 410 of FIG. 4. In one embodiment, at least a portion of the selected portions 1014 may be stored in the buffer 1012 while each the plurality of data blocks is being sent to the encoder 1006 as the data block 1008. In another embodiment, the selected portions 1014 may be selected prior to or after encoding each of the plurality of data blocks.

According to one embodiment, the codeword 1002 is the codeword described in block 412 of FIG. 4 and block 502 of FIG. 5, wherein the codeword 1002 has a length of 'xL+(x+1)p'. In one such embodiment, the codeword 1002 comprises the corresponding codewords and the other parity portion described in blocks 406 and 410 of FIG. 4, respectively. In another embodiment, the codeword 1002 has a length of 'x(L+p)'. In one such embodiment, the codeword 1002 comprises the corresponding codewords, the other parity portion, and the selected portions, described in blocks 406, 410, and 408 of FIG. 4, respectively. In yet another embodiment, the codeword 1002 has another length, wherein the length of the codeword 1002 is longer than the block length of the codeword 1009.

According to one embodiment, the apparatus further comprises logic to divide the codeword 1002 into corresponding codewords and to send each of the corresponding codewords to the decoder 1016 as a codeword 1018 to recover a data block 1022, wherein the data block 1022 is, at one point in the processes, each of the plurality of data blocks in block 606 of FIG. 6, as well as the corresponding portions in block 810 of FIG. 8. In one embodiment, the decoder 1016 applies the linear block code, which is the same code applied by the encoder 1006.

In one embodiment, the error correction logic 1020 is operable to perform the same functions as the error correction logic 907 of FIG. 9.

Figure 11:
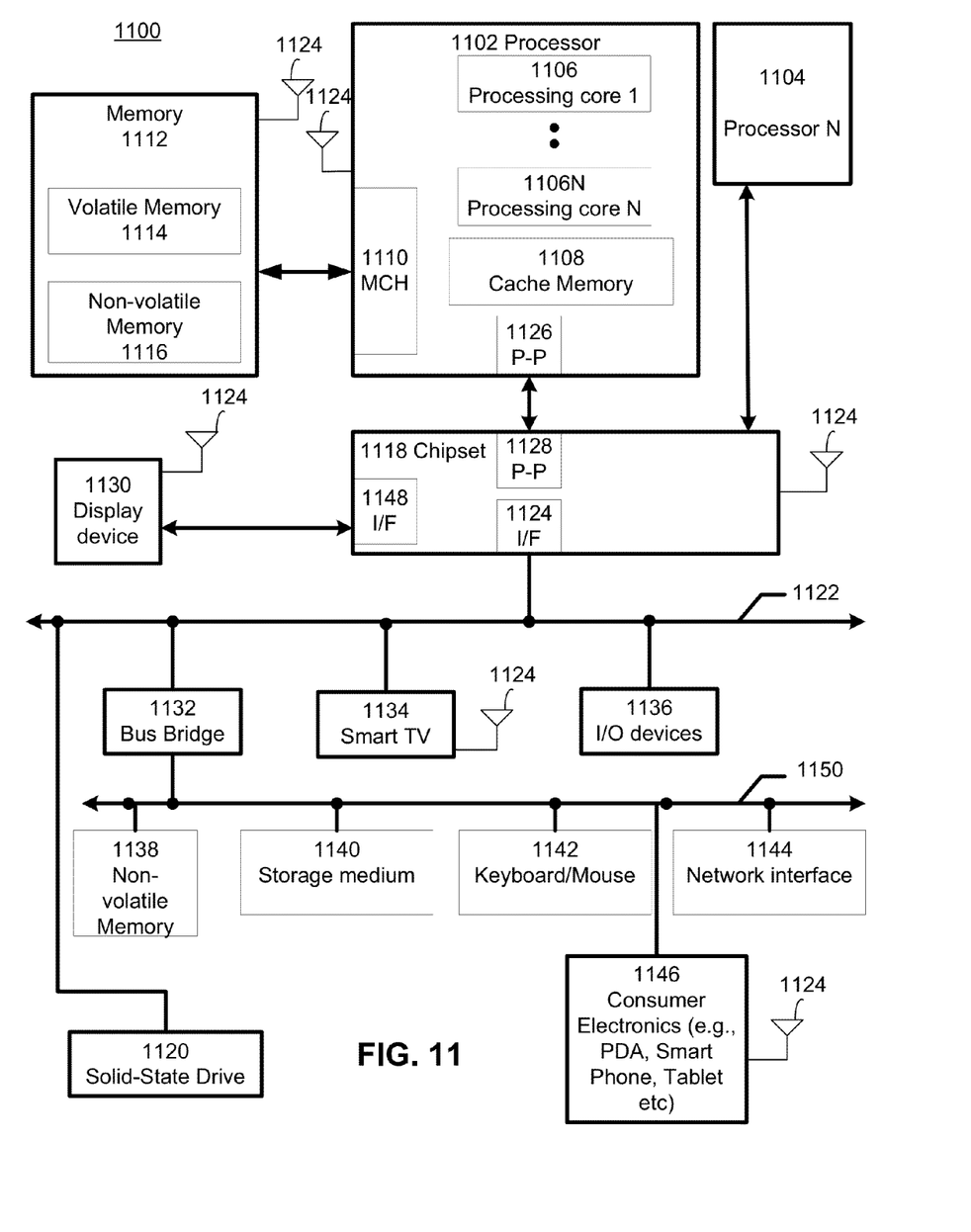
FIG. 11 is a system diagram comprising a host system coupled to a solid-state drive and a display, the solid-state drive comprising logic to generate and decode a longer linear block codeword using a shorter block length according to one embodiment.

FIG. 11 is a system 1100 according to one embodiment comprising a host system coupled to a solid-state drive and a display, the solid-state drive comprising logic operable to generate a codeword having a block length equal to the first block length using the second block length (wherein the first and second block lengths are the same as those described in block 302 of FIG. 3).

FIG. 11 also includes a machine-readable storage medium to execute computer readable instructions to perform the methods of various embodiments. Elements of embodiments are also provided as a machine-readable medium for storing the computer-executable instructions (e.g., instructions to implement the flowcharts of FIGS. 3-8). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the system 1100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, the system 1100 implements the methods disclosed herein and may be a system on a chip (SOC) system.

In one embodiment, the processor 1102 has one or more processing cores 1106 and 1106N, where 1106N represents the Nth processor core inside the processor 1102 where N is a positive integer. In one embodiment, the system 1100 includes multiple processors including processors 1102 and 1104, where processor 1104 has logic similar or identical to logic of processor 1102. In one embodiment, the system 1100 includes multiple processors including processors 1102 and 1104 such that processor 1104 has logic that is completely independent from the logic of processor 1102. In such an embodiment, a multi-package system 1100 is a heterogeneous multi-package system because the processors 1104 and 1102 have different logic units. In one embodiment, the processing core 1106 includes, but is not limited to, pre-fetch logic to fetch instructions, decode logic to decode the instructions, execution logic to execute instructions and the like. In one embodiment, the processor 1102 has a cache memory 1108 to cache instructions and/or data of the system 1100. In another embodiment of the invention, the cache memory 1108 includes level one, level two and level three, cache memory, or any other configuration of the cache memory within the processor 1102.

In one embodiment, processor 1102 includes a memory control hub (MCH) 1110, which is operable to perform functions that enable the processor 1102 to access and communicate with a memory 1112 that includes a volatile memory 1114 and/or a non-volatile memory 1116. In one embodiment, the memory control hub (MCH) 1110 is positioned outside of the processor 1102 as an independent integrated circuit.

In one embodiment, the processor 1102 is operable to communicate with the memory 1112 and a chipset 1118. In one embodiment, the processor 1102 (same as 914 of FIG. 9) and the chipset 1118 are part of the host 910 of FIG. 9. In one embodiment, the chipset 1118 is coupled to an SSD 1120 (same as 901 of FIG. 9) via a SATA bus 1122 (same as bus 912 of FIG. 9). In one embodiment, the SSD 1120 includes machine-readable medium for storing the computer-executable instructions to implement the flowchart of FIGS. 3-8. In such an embodiment, the SSD 1120 executes the computer-executable instructions when the SSD 1120 is powered up.

In one embodiment, the processor 1102 is also coupled to a wireless antenna 1124 to communicate with any device configured to transmit and/or receive wireless signals. In one embodiment, the wireless antenna interface 1124 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 1114 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1116 includes, but is not limited to, flash memory (e.g., NAND, NOR), phase change memory (PCM), read-only memory (ROM), electrically erasable programmable read-only memory (EEPROM), or any other type of non-volatile memory device.

The memory 1112 stores information and instructions to be executed by the processor 1102. In one embodiment, memory 1112 may also store temporary variables or other intermediate information while the processor 1102 is executing instructions. In one embodiment, chipset 1118 connects with processor 1102 via Point-to-Point (PtP or P-P) interfaces 1126 and 1128. In one embodiment, chipset 1118 enables processor 1102 to connect to other modules in the system 1100. In one embodiment of the invention, interfaces 1126 and 1128 operate in accordance with a PtP communication protocol such as the INTEL® QuickPath Interconnect (QPI) or the like.

In one embodiment, the chipset 1118 is operable to communicate with the processor 1102, 1104, display device 1130, and other devices 1132, 1134, 1136, 1138, 1140, 1142, 1144, 1146, etc. In one embodiment, the chipset 1118 is also coupled to a wireless antenna 1124 to communicate with any device configured to transmit and/or receive wireless signals.

In one embodiment, chipset 1118 connects to a display device 1130 via an interface 1148. In one embodiment, the display 1130 includes, but is not limited to, liquid crystal display (LCD), plasma, cathode ray tube (CRT) display, or any other form of visual display device. In one embodiment of the invention, processor 1102 and chipset 1118 are merged into a single SOC. In addition, the chipset 1118 connects to one or more buses 1122 and 1150 that interconnect various modules 1136, 1138, 1140, 1142, and 1144. In one embodiment, buses 1122 and 1150 may be interconnected together via a bus bridge 1132 if there is a mismatch in bus speed or communication protocol. In one embodiment, chipset 1118 couples with, but is not limited to, a non-volatile memory 1138, a mass storage device(s) 1140, a keyboard/mouse 1142, and a network interface 1144 via interface 1124, smart TV 1134, consumer electronics 1146, etc.

In one embodiment, the mass storage device 1140 includes, but is not limited to, a solid-state drive, a hard disk drive, a universal serial bus flash memory drive, or any other form of computer data storage medium. In one embodiment, network interface 1144 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, HomePlug AV (HPAV), Ultra Wide Band (UWB), Bluetooth, WiMAX, or any form of wireless communication protocol.

While the modules shown in FIG. 11 are depicted as separate blocks within the system 1100, the functions performed by some of these blocks may be integrated within a single semiconductor circuit or may be implemented using two or more separate integrated circuits. For example, although the cache memory 1108 is depicted as a separate block within the processor 1102, the cache memory 1108 can be incorporated into the processor core 1106 respectively. In one embodiment, the system 1100 may include more than one processor/processing core in another embodiment of the invention.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   receiving data from a storage area; and
   generating a codeword from the received data with an encoder, the codeword having a data portion and a parity portion, wherein the codeword has a first block length, and wherein the encoder applies a linear block code, the linear block code having a second block length that is shorter than the first block length, wherein generating the codeword comprises:
   dividing the received data into a plurality of data blocks;
   encoding, by the encoder, each of the plurality of data blocks to generate corresponding codewords, each of the corresponding codewords having a block length equal to the second block length, and each of the corresponding codewords having a data portion and a parity portion;
   selecting one or more portions of one or more of the plurality of data blocks; and
   encoding, by the encoder, the selected one or more portions to generate another parity portion.

2. The method of claim 1, wherein the linear block code is a low-density parity-check (LDPC) code.

3. The method of claim 1, wherein the selected portions of one or more of the plurality of data blocks have a combined length equal to each of the blocks in the plurality of data blocks.

4. The method of claim 1, wherein the length of the data portion of the codeword is an integer multiple of the length of the data portion of each of the corresponding codewords.

5. The method of claim 1, wherein the selected one or more portions have a combined length equal to the length of each of the plurality of data blocks.

6. The method of claim 1, wherein selecting the one or more portions comprises:
   selecting an equal portion from each of the plurality of data blocks.

7. The method of claim 1 further comprising prior to encoding the selected one or more portions:
   queuing at least one of the selected one or more portions in a buffer.

8. The method of claim 1, wherein the data portion of the codeword is 4 Kbytes and the data portion of each of the corresponding codewords is 1 Kbyte.

9. The method of claim 1, wherein generating the codeword further comprises:
   generating another codeword, the other codeword comprising the selected one or more portions and the other parity portion.

10. The method of claim 1, further comprising:
    receiving the codeword; and
    decoding the received codeword with a linear block decoder, wherein the linear block decoder applies the linear block code.

11. The method of claim 10 further comprising:
    dividing the received codeword into the corresponding codewords; and
    decoding, by the linear block decoder, each of the corresponding codewords.

12. The method of claim 11 further comprising:
    in response to unsuccessful decoding of one or more of the corresponding codewords, decoding the other parity portion; and
    applying information obtained from decoding the other parity portion to re-decode one or more of the corresponding codewords.

13. The method of claim 12, wherein applying information obtained from decoding of the other parity portion comprises:
    in response to successful decoding of the other parity portion, replacing at least one portion of the corresponding codewords with corresponding portions obtained from decoding the other parity portion; and
    in response to unsuccessful decoding of the other codeword, replacing at least one portion of the corresponding codewords with corresponding portions obtained from decoding the other parity portion by output soft information combination.

14. The method of claim 10, wherein the storage area is a non-volatile memory.

15. The method of claim 14, wherein the non-volatile memory is a NAND memory.

16. An apparatus comprising:
    a first logic unit to receive data;
    an encoder;

a second logic unit to divide the received data into a plurality of data blocks and to send each of the plurality of data blocks to the encoder, wherein the encoder applies a linear block code to each of the plurality of data blocks to generate corresponding codewords;

a third logic unit to generate a codeword having a first block length from the corresponding codewords, each of the corresponding codewords having a second block length, wherein the linear block code has a block length equal to the second block length, and the second block length is shorter than the first block length;

a buffer to store one or more selected portions of the received data; and a fourth logic unit to send the selected portions to the encoder to generate another parity portion.

17. The apparatus of claim 16, wherein the selected portions of the received data have a combined length equal to each of the blocks in the plurality of data blocks.

18. The apparatus of claim 16, wherein the one or more selected portions are selected from the plurality of data blocks.

19. The apparatus of claim 16 further comprising:
a fifth logic unit to receive the codeword;
a linear block decoder to apply the linear block code; and
a sixth logic unit to divide the received codeword into the corresponding codewords and to send each of the corresponding codewords to the linear block decoder.

20. The apparatus of claim 19 further comprising:
a seventh logic unit to determine whether decoding of the corresponding codewords is successful;
an eighth logic unit to send another codeword to the linear block decoder when the decoding of one or more of the corresponding codewords is unsuccessful, wherein the other codeword comprises the selected portions and the other parity portion;
a ninth logic unit operable to replace one or more portions of the corresponding codewords with corresponding portions of the other codeword; and
a tenth logic unit operable to resend one or more of the corresponding codewords to the linear block decoder.

21. The apparatus of claim 20, wherein the ninth logic unit comprises:
a logic that, in response to successful decoding of the other codeword, is operable to replace at least one portion of the corresponding codewords with the corresponding portions of the other codeword, and in response to unsuccessful decoding of the other codeword, is operable to replace one or more portions of the corresponding codewords with the corresponding portions of the other codeword by output soft information combination.

22. A system comprising:
a display; and
a solid-state drive (SSD) coupled to the display, the SSD comprising:
a memory controller coupled to a non-volatile memory, the memory controller comprising an encoder, the memory controller operable to:
receive data;
divide the received data into a plurality of data blocks;
send each of the plurality of data blocks to the encoder, wherein the encoder applies a linear block code to each of the plurality of data blocks to generate corresponding codewords;
generate a codeword having a first block length from the corresponding codewords, each of the corresponding codewords having a second block length, wherein the linear block code has a block length equal to the second block length, and the second block length is shorter than the first block length; and
store, using a buffer, one or more selected portions of one or more of the plurality of data blocks; and
wherein the memory controller is operable to send the selected portions to the encoder to generate another parity portion.

23. The system of claim 22, wherein the selected portions of the of one or more of the plurality of data blocks have a combined length equal to each of the blocks in the plurality of data blocks.

24. The system of claim 22, wherein the memory controller further comprises a linear block decoder to apply the linear block code, and wherein the memory controller is operable to:
receive the codeword having a first block length;
divide the received codeword into the corresponding codewords; and
send each of the corresponding codewords to the linear block decoder.

25. The system of claim 24, wherein the memory controller is operable to:
determine whether decoding of the corresponding codewords is successful;
send another codeword to the linear block decoder when the decoding of one or more of the corresponding codewords is unsuccessful, wherein the other codeword comprises the one or more selected portions and the other parity portion;
replace one or more portions of the corresponding codewords with corresponding portions of the other codeword; and
resend one or more of the corresponding codewords to the linear block decoder.

26. The system of claim 25, wherein the memory controller is operable to:
in response to successful decoding of the other codeword, replace at least one portion of the corresponding codewords with the corresponding portions of the other codeword, and in response to unsuccessful decoding of the other codeword, to replace one or more portions of the corresponding codewords with the corresponding portions of the other codeword by output soft information combination.

27. The system of claim 22, wherein the SSD comprises a NAND flash memory, and wherein the memory controller is an SSD controller.

28. The system of claim 22 further comprising:
an antenna; and
a radio-frequency circuitry coupled to the antenna to receive signal data to be stored on the non-volatile memory.

* * * * *